United States Patent [19]

Ueno et al.

[11] Patent Number: 4,901,248

[45] Date of Patent: Feb. 13, 1990

[54] PRINTING DEVICE WITH COMPRESSED TEXT DATA MEMORY

[75] Inventors: Hideo Ueno, Nagoya; Keiko Yamada, Ama, both of Japan

[73] Assignee: Brother Kogyo Kabushiki Kaisha, Nagoya, Japan

[21] Appl. No.: 139,740

[22] Filed: Dec. 30, 1987

[30] Foreign Application Priority Data

Jan. 7, 1987 [JP] Japan ................................. 62-1217

[51] Int. Cl.$^4$ .............................................. G06F 5/00
[52] U.S. Cl. .................................... 364/519; 400/3; 341/90
[58] Field of Search ................ 364/200, 900, 518, 519; 341/55, 90, 99, 87; 400/3–5, 9

[56] References Cited

U.S. PATENT DOCUMENTS

| 4,054,951 | 10/1977 | Jackson et al. | 364/900 |
| 4,458,333 | 7/1984 | Smith | 364/523 X |
| 4,467,363 | 8/1984 | Tench, Jr. | 364/523 X |
| 4,597,057 | 6/1986 | Snow | 364/900 |
| 4,641,263 | 2/1987 | Perlman et al. | 364/519 X |
| 4,701,745 | 10/1987 | Waterworth | 364/900 X |

Primary Examiner—David L. Clark
Attorney, Agent, or Firm—Oliff & Berridge

[57] ABSTRACT

A printing device with a data memory efficiently stores character code data and other attribute data in a limited memory region. If a character code of a print data input from the keyboard is a space code, the print data is nullified, and a pitch data corresponding to the space code is added to the pitch data corresponding to the character code previously stored in a correction memory. Namely, the data are compressed. Since only the print data excepting the space code data is stored in the memory, the limited memory region is efficiently used.

5 Claims, 10 Drawing Sheets

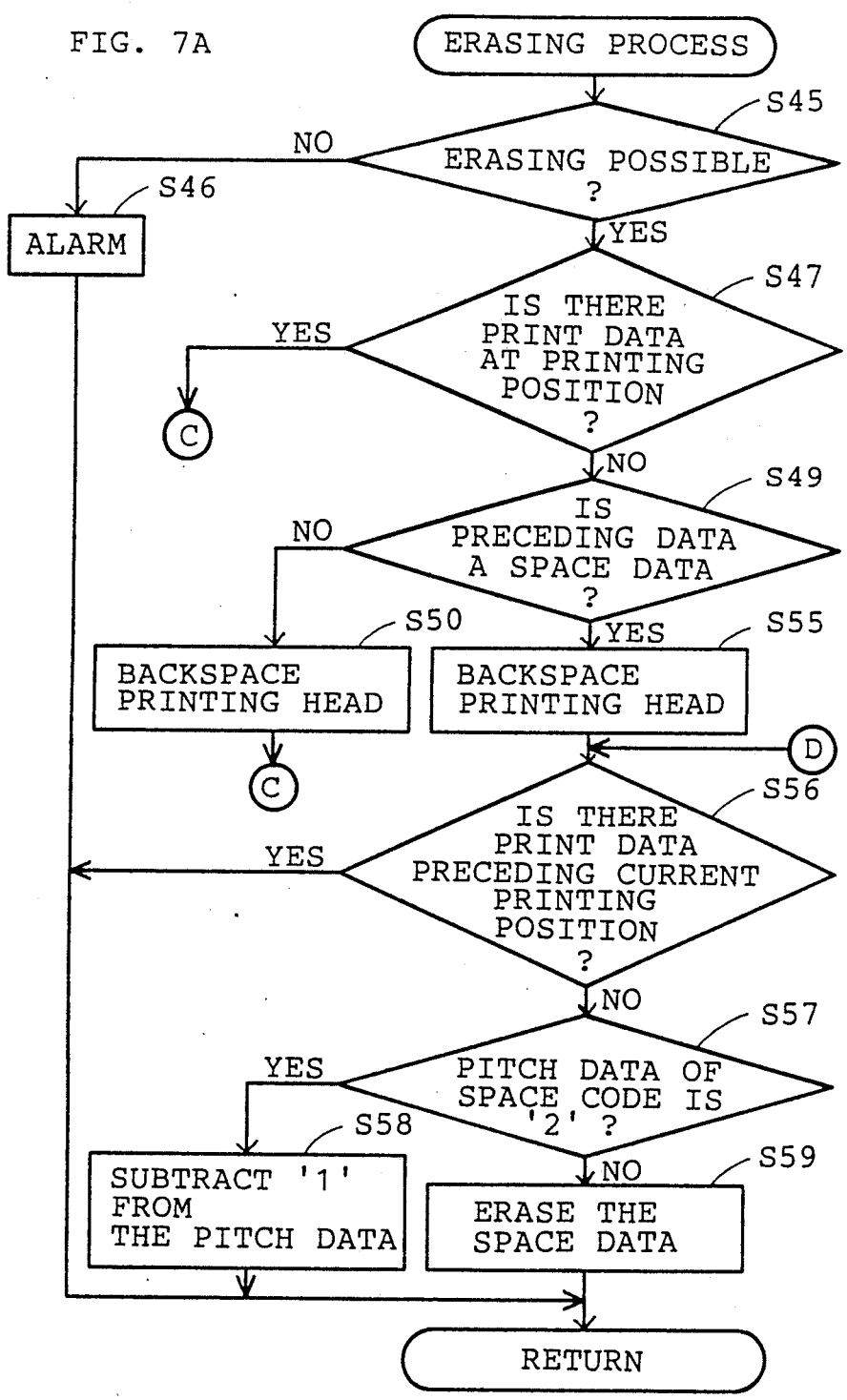

PRINTING DEVICE WITH COMPRESSED TEXT DATA MEMORY

BACKGROUND OF THE INVENTION

1. Field of the Invention

This invention relates to a printing device in which print data is serially stored in a memory and a character is printed based on the print data.

2. Prior Art

One type of a conventional printing device includes memory means for serially storing print data which is composed of a character code data corresponding to an input character key and an attribute code data. A character is printed based on the stored print data.

Especially in an electronic typewriter, since at least one space is always required between words, space data occupies a large ratio of the memory capacity. Namely, a large-scaled memory means is required.

SUMMARY OF THE INVENTION

Accordingly, it is an object of the present invention to provide a printing device in which the print data is efficiently stored in a limited memory region.

To achieve this object, the present invention has objects and structure as set forth herein. Namely, a printing device with a data memory includes:

data storing means for serially storing a print data in the data memory, the print data including the data input from the input means and an attribute data corresponding to the data; and data coding means responsive to the space code input from the input means for not storing the space code in the data memory and for adding a compressive information to the attribute data of the preceding data.

The above-mentioned structure provides the memory region with the maximum of its efficiency so that the input print data can be efficiently stored in the limited memory region.

BRIEF DESCRIPTION OF DRAWINGS

By way of example and to make the description clearer, reference is made to the accompanying drawings in which:

FIGS. 7A and 7B are flowcharts of a character erasing process; and

DETAILED DESCRIPTION OF PREFERRED EMBODIMENT

A preferred embodiment of the present invention is set forth with reference to FIGS. 1 through 8.

Figure 2:
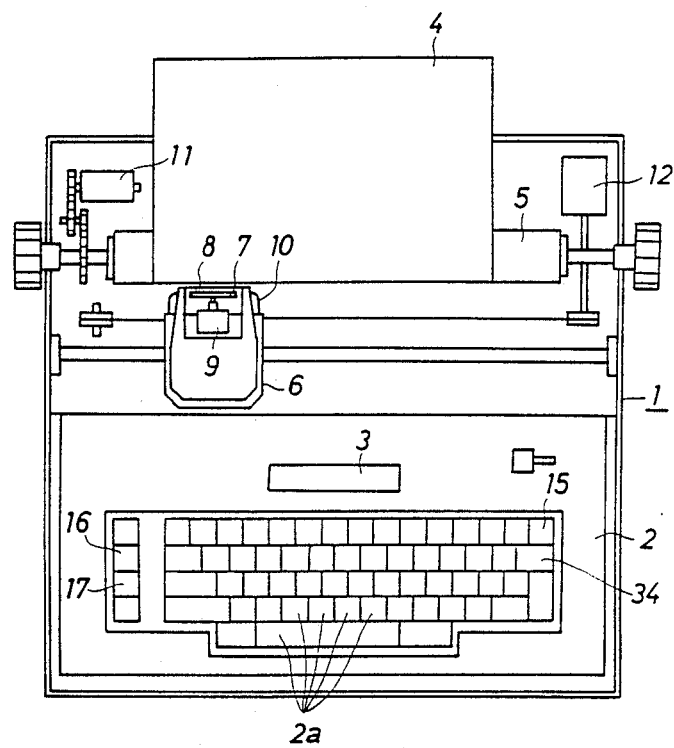
FIG. 2 is a plan view of an electronic typewriter in a preferred embodiment.

As shown in FIG. 2, an electronic typewriter 1, as a printing device of the present invention, has a keyboard 2 including a plurality of character keys 2a, a display unit 3 for displaying input characters and a platen 5 on which paper 4 is set. In the front of the platen 5, a carriage 6 is provided to be movable along the platen 5. A printing head 7 including a daisy wheel and a print hammer 9 is located on the carriage 6. The print hammer 9 hits a type on the printing head 7 to print the character on the paper 4 via a print ribbon 8. Under the print ribbon 8, a correction ribbon 10 is provided parallel to the print ribbon 8.

The platen 5 is rotated by a line feed motor 11 provided on the left side behind the platen 5. The carriage 6 is driven by a carriage drive motor 12 provided on the right side behind the platen 5 to move the carriage 6 in the printing direction according to a pitch data (described later). The printing head 7 is rotated by a character selecting motor 13 so that the type corresponding to the operated character key 2a is set at the printing position. The print ribbon 8 and the correction ribbon 10 are supported by a holder (not shown). The holder is vertically moved by a ribbon lift motor 14 via a known cam mechanism (not shown) to selectively set the print ribbon 8 or the correction ribbon 10 at the printing position. The correction ribbon 10 and the print ribbon 8 are respectively rewound by the ribbon lift motor 14 and a ribbon rewind motor 8a.

The keyboard 2 further includes a back space key 15, a carriage return key 34, a correction key 16, and a relocation key 17. By operating the back space key 15, the printing head 7 is backspaced (moved backward) from the current input position. The carriage return key 34 functions to move the printing head 7 to the left margin so as to renew the position for a new printing line by feeding the paper 4 at a predetermined line interval. The correction key 16 drives the printing head 7 to erase the improperly printed character in accordance with a print data 31 stored in a correction memory 28. When the relocation key 17 is operated after the correction, the carriage drive motor 12 is actuated to relocate the printing head 7 from the correction position to the latest input position.

Figure 1:
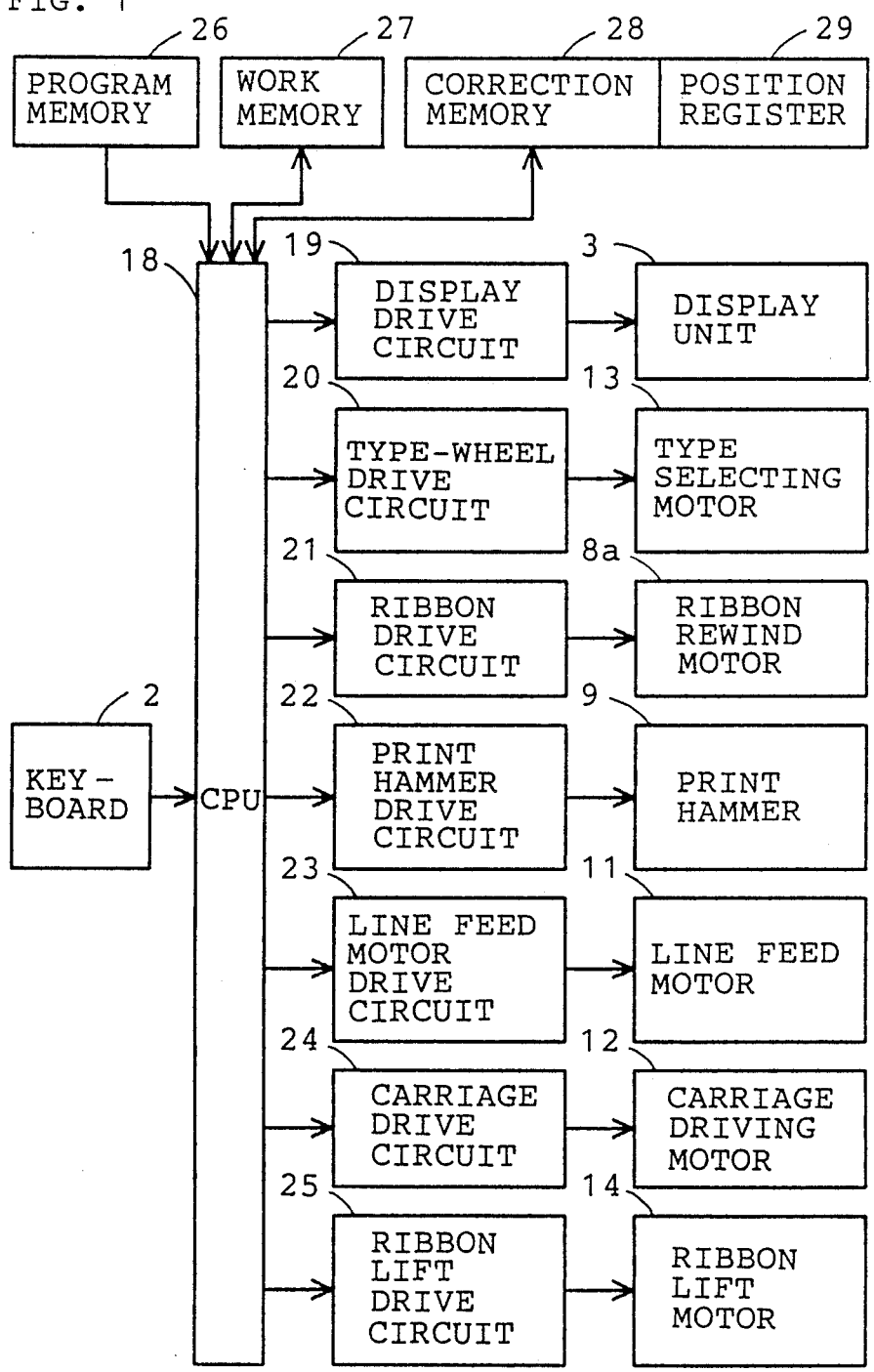
FIG. 1 is a block diagram showing the electrical schematic of a printing device of the present invention.

The following explains the electrical construction of the electronic typewriter 1 based upon FIG. 1.

The keyboard 2 and a display drive circuit 19 are connected to a CPU 18. When the print data 31 is input from the keyboard 2 by operating the character key 2a, the CPU 18 determines to display the input data on the display unit 3 via the display drive circuit 19. The print data 31 is composed of 2 bytes (16 bits) of data. The upper 1 byte is assigned to a character code 31a corresponding to a character 30. The lower 1 byte is assigned to an attribute data including attribute code flags such as an underline and a boldface, and to a pitch data 31b for determining a print pitch.

The pitch data 31b is used for determining the position of the character 30 to be printed next based on the input print data 31. In the present embodiment, a minimum unit, 1 bit (0 or 1), is assigned to the pitch data 31b. When the pitch data 31b is '0', the character 30 according to the print data 31 to be input next is printed at the position one unit (1 character pitch) forward from the current printing position. When the pitch data 31b is '1', the character 30 is printed at the position two units forward from the current printing position. To make the explanation clearer, the above-mentioned '0' and '1' are replaced with '1' and '2', respectively. Namely, one unit is denoted by '1', and two units by '2'.

The CPU 18 is further connected with the following various circuits: a type wheel drive circuit 20 for driving the word selecting motor 13; a ribbon drive circuit 21 for driving the ribbon rewind motor 8a; a print hammer drive circuit 22 for driving the print hammer 9; a line feed motor drive circuit 23 for driving the line feed motor 11; a carriage drive circuit 24 for actuating the carriage driving motor 12; a ribbon lift drive circuit 25 for driving the ribbon lift motor 14; and an alarm drive circuit (not shown) for alarming when a wrong key is operated.

Figure 3:
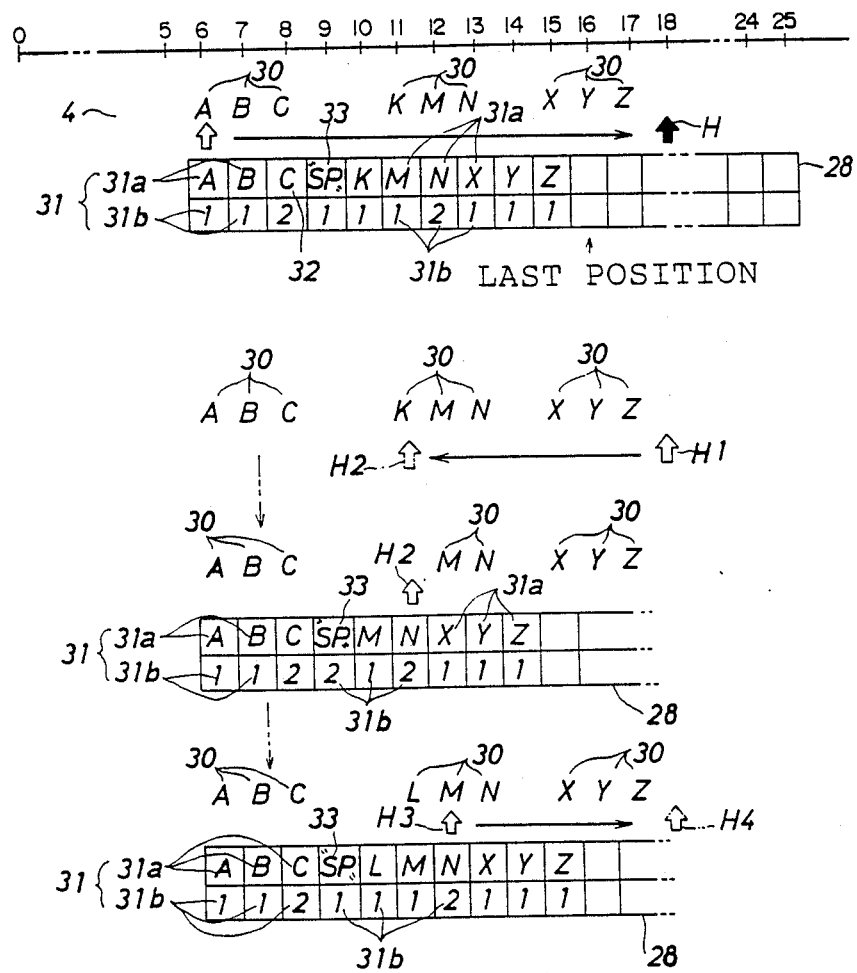
FIG. 3 illustrates location of a printing head, printed characters and print data stored in a correction memory in the embodiment.

The CPU 18 controls the drive circuits 20 through 25 so that the characters 30 displayed on the display unit 3 are sequentially printed on the paper 4 as illustrated in FIG. 3. When a back space signal is input by operating the back space key 15 on the keyboard 2, the CPU 18 controls the carriage drive circuit 24 to actuate the carriage driving motor 12 so as to backspace the printing head 7 from the current input position.

The CPU 18 is further connected with a program memory 26 which stores a control program for controlling an electronic typewriter 1 and with a work memory 27 for storing the calculation result by the CPU 18, which includes a memory region (hereinafter referred to as a head counter) for storing the current position of the printing head 7 (a column number, e.g., 18, denoted by an arrow H in FIG. 3) in a line. The work memory 27 stores a left margin (e.g., fifth column in FIG. 3) and a right margin which are previously determined by an operator.

A predetermined number of print data 31 (e.g., 20 in the present embodiment) corresponding to the character 30 to be printed at a predetermined position in a line on the paper 4 is stored in the correction memory 28. The print data 31 is output to the CPU 18 by operating the character key 2a. Although the present embodiment shows only the character code 31a and the pitch data 31b in FIG. 3, other data corresponding to the attributes such as the underline and the boldface are also stored in the memory 28.

When the character code 31a of the input print data 31 is a space code 33, the input print data 31 is nullified, and the pitch data 31b corresponding to the space code 33 is added to the pitch data 31 corresponding to a character code 32 previously stored in the correction memory 28. Thus, the data are compressed. However, when the pitch data 31b corresponding to the space code 33 has already been added to the pitch data 31b corresponding to the character code 32 previously stored in the correction memory 28, namely, when the pitch data 31b stored in the correction memory has been '2', it is determined the data has been compressed. Accordingly, the input pint data 31 corresponding to the space code 33 is not nullified and stored in the correction memory 28.

When the number of the print data 31 exceeds a predetermined capacity of the correction memory, i.e., the correction memory 28 becomes FULL, the whole print data 31 is shifted to the left, and the leftmost print data 31 is shifted out of the correction memory 28. Moreover, the correction memory 28 includes a position register 29 for storing a position data corresponding to the printing position (column number) of the initial character based on the print data 31 stored in the leftmost position. After the excess print data 31 is shifted out of the correction memory 28, the position register 29 is updated by adding the pitch data 31b corresponding to the print data 31.

When a character erasing signal is input from the correction key 16 on the keyboard 2, the print mode is changed to the correction mode. In this mode, the CPU 18 outputs instructions to erase the improper character 30 printed on the paper 4 at which the printing head 7 is positioned. In place of the erased character, a new character is printed on the paper 4 in accordance with a new print data 31 input from the character keys 2a.

When a relocation signal is input from the relocation key 17, the whole pitch data 31b stored in the correction memory 28 is added to the initial position data stored in the position register 29. Thus, the position where the printing head 7 should be relocated, i.e., the latest input position is calculated. The carriage driving motor 12 is kept driven until the position stored in the head counter of the work memory 27 becomes equal to the calculated latest input position.

Operations of the electronic typewriter 1 having the above-mentioned constitution are set forth with reference to FIG. 3 and the flowcharts of FIGS. 4 through 8.

Figure 4:
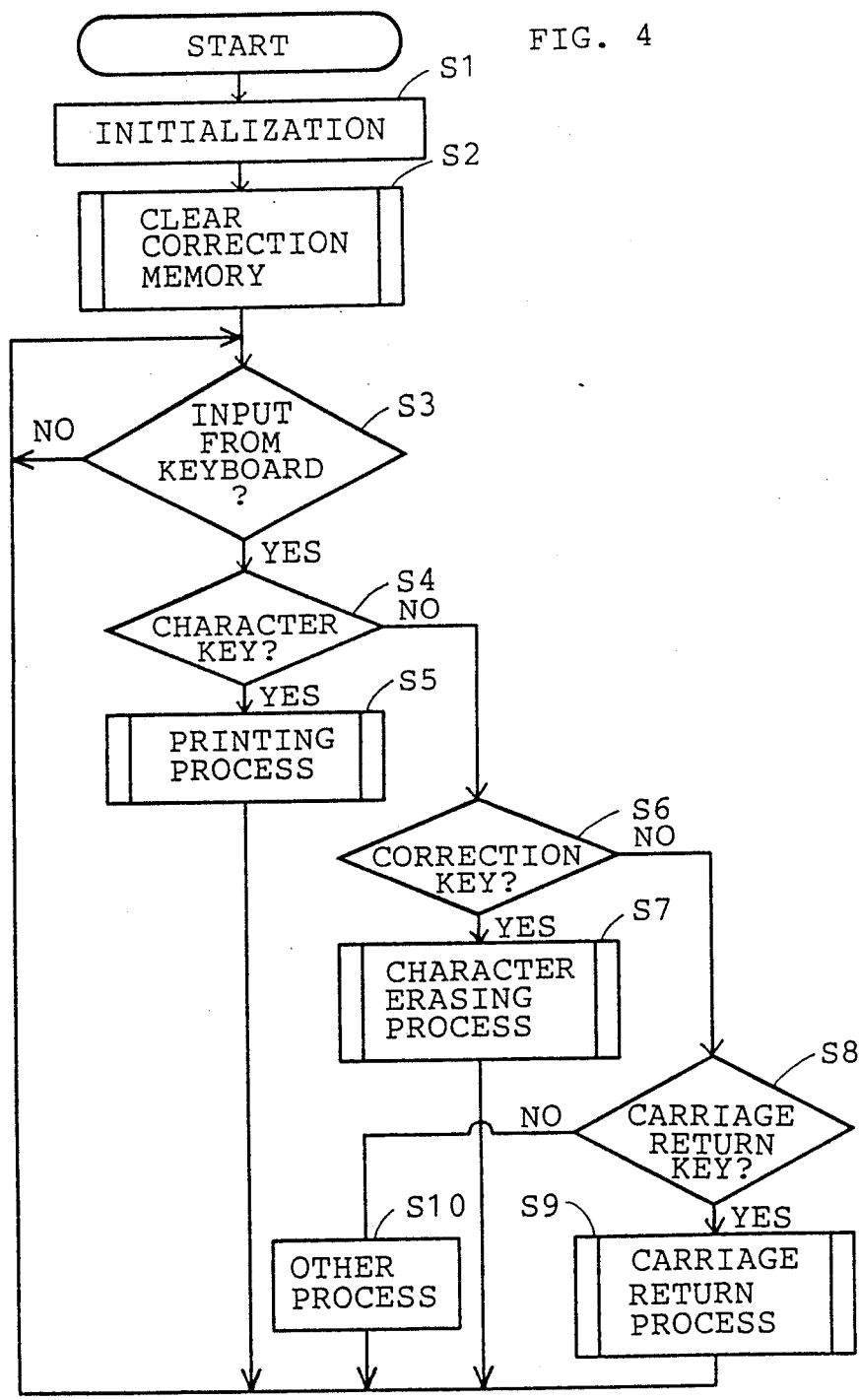
FIG. 4 is a flowchart showing a flow of various actions executed in the embodiment.
Figure 5:
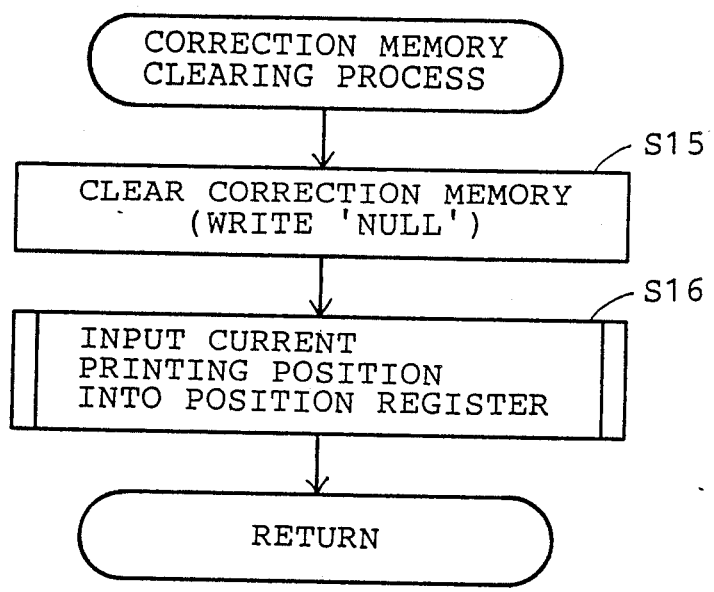
FIG. 5 is a flowchart of a correction memory clearing process.

When the electronic typewriter 1 is switched on, initialization is executed at step 1 (hereinafter S1) in FIG. 4. Namely, the initial position of the carriage 6 is determined and the printing head 7 is positioned at the left margin previously stored in the work memory 27. At S2, the correction memory 28 is cleared. The process at S2 is detailed in the flowchart of FIG. 5. As shown in FIG. 5, all of the print data 31 stored in the correction memory 28 is erased and rewritten with 'NULL' at S15, and the current position of the printing head (e.g., 6th column in the present embodiment) is stored in the position register 29 at S16.

Then, the process step proceeds to S3, where the CPU 18 prepares for receiving input. When a data is input, the CPU 18 determines at S4 whether the data is input by operating the character key 2a or other keys. If it is determined the character key 2a is operated, the printing operation is started. Namely, the print means are actuated and the print data 31 is stored in the correction memory 28 at S5.

Figure 6A:
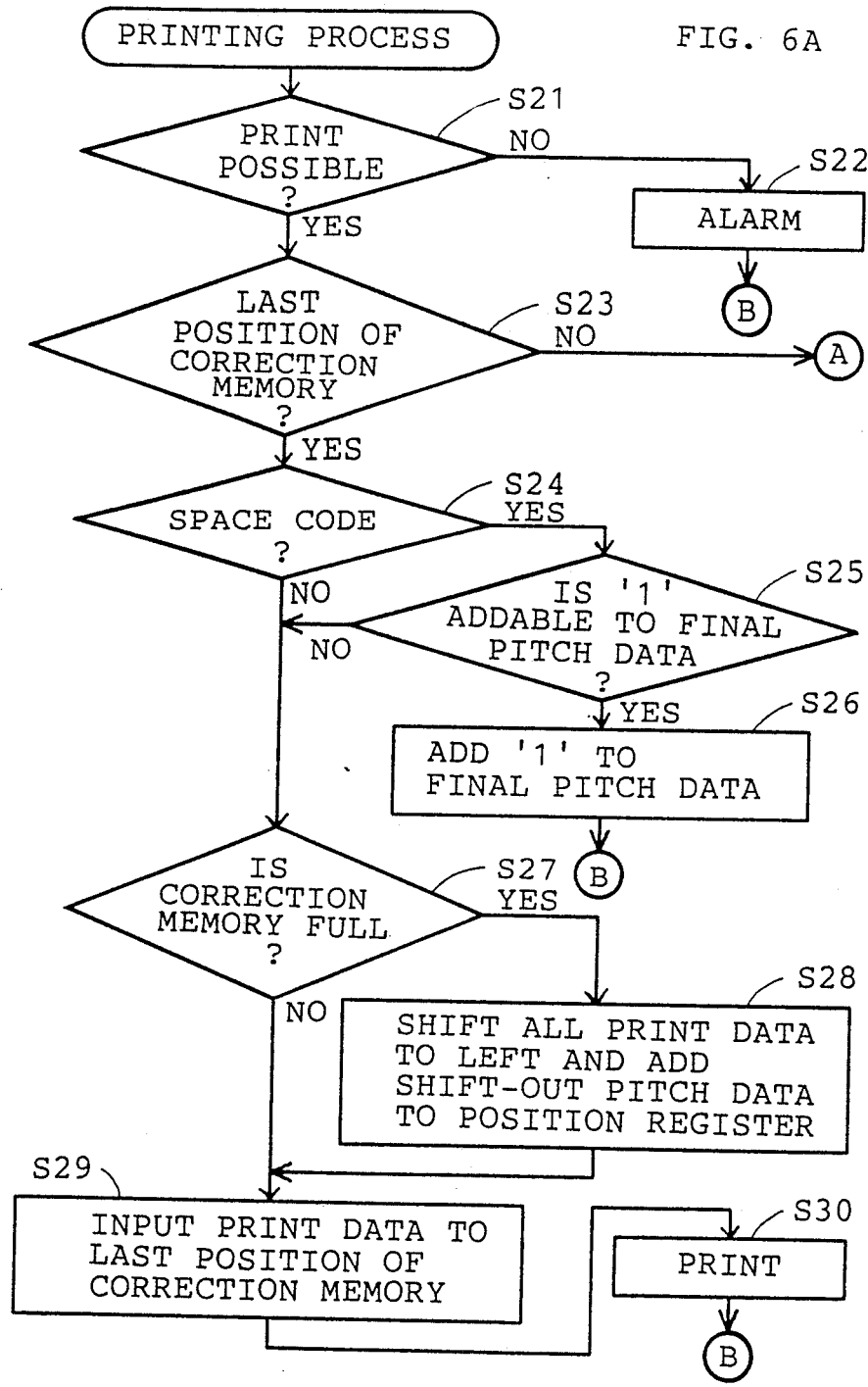
FIGS. 6A and 6B are flowcharts of a printing process.
Figure 6B:
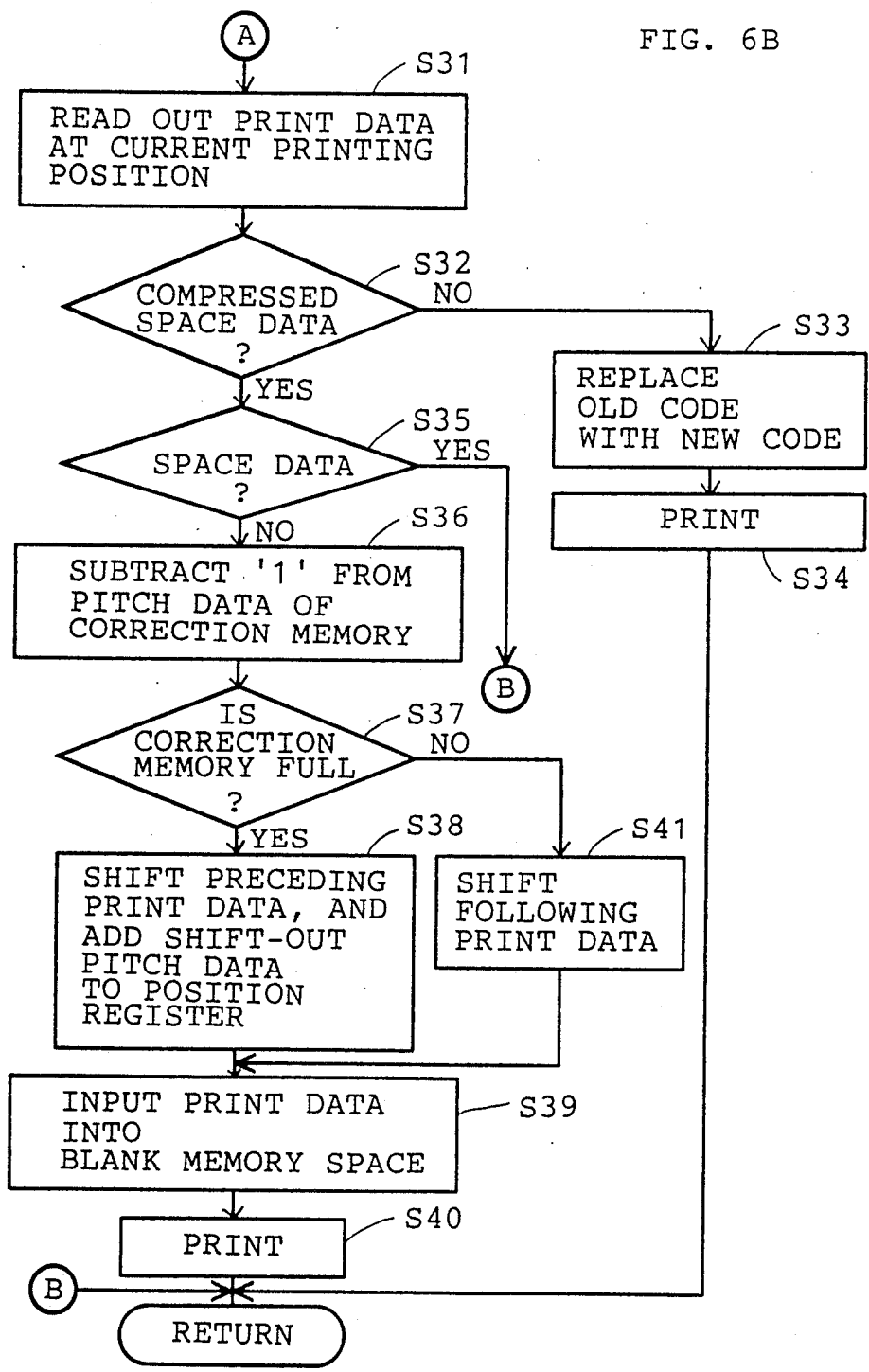

The printing operation is described in detail with reference to the flowcharts of FIGS. 6A and 6B. At S21, it is determined whether the position of the printing head 7 has reached the right margin. If the answer is YES at S23, the alarm is actuated at S22. If the answer is NO, it is determined at S23 whether the position of the correction memory 28 for storing the print data 31 follows the last position of the stored print data 31. If the answer is YES, it is determined at S24 whether the character code 31a of the print data 31 is a space code. If the answer is YES, the CPU 18 determines at S25 whether it is possible to add '1' to the pitch data 31b of the print data 31 at the last position. If possible, the pitch data 31b corresponding to the space code 33 is added to the pitch data 31b corresponding to the stored character code 31a by adding '1' at S26.

On the other hand, when the character code 31a is not the space code 33 or the pitch data 31b of the last print data 31 has already been '2', it is determined at S27 whether the correction memory 28 is FULL. If the answer is YES, the whole print data 31 stored in the correction memory 28 is shifted to the left, and the pitch data 31b of the erased print data 31 at the initial (leftmost) position is added to the position register 29 at S28. At subsequent S29, the print data 31 is input to the last position of the correction memory 28. At S30, the character corresponding to the input print data 31 is printed by the printing head 7. On the other hand, if the answer is NO at S28, namely, when the correction memory 28 is not FULL, the print data 31 is input to the last position of the correction memory 28 at S29, and the data 31 is printed by the printing head 7 at S30.

In the case that the print data 31 is not input to the last position but to a halfway position of the correction memory 28, e.g., when the character 'K' is replaced by the character 'L' as shown in FIG. 3 by the character erasing process, the print data 31 corresponding to the current position of the printing head 7 is read out from the correction memory 28 at S31. At subsequent S32, it is determined whether the pitch data 31b of the print data 31 is '2' and also it is a compressed space data (the space data at the 9th and 14th column in FIG. 3). If the print data 31 is not the compressed space data, the character code 33 of the print data 31 is replaced by a character code 31 corresponding to the character 30 to be printed at S33, and printed at S34.

On the other hand, if the print data corresponding to the current printing position is a compressed space data and also it is determined at S35 that the print data is not a space data, '1' is subtracted from the pitch data 31b at S36. At subsequent S37, it is determined whether the correction memory 28 is FULL. If the answer is YES, the print data 31 in the left side of the current printing position is all shifted to the left, and the pitch data 31b of the shifted out print data 31 is added to the position register 29 at S38. Then, the print data 31 which is newly stored in the memory space instead of the erased data is input at S39, and is printed by the printing head at S40. On the other hand, if the correction memory 28 is not FULL at S37, the print data 31 in the right side of the current printing position is all shifted to the right at S41. Then the process step proceeds to S39 at which the new print data 31 is input at the vacant position. After that, the print data 31 is printed at S40.

As described hereinabove, by operating the character key 2a, the print data 30 corresponding to the operated character key 2a are serially printed on the paper 4. At the same time, the print data 31 corresponding to the character key 2a are stored in order in the correction memory 28.

For example, when 'LMN' is mistyped as 'KMN' as illustrated in FIG. 3, i.e., when 'K' should be corrected to 'L', the correction is carried out as follows. First, the printing head 7 is moved from the position shown by an arrow H1 (18th column) to the position shown by an arrow H2 (11th column) by operating the back space key 15. Then, the correction key 17 is operated. When the CPU 18 determines the correction key 17 is operated at S6, the character is erased at S7.

Figure 7B:
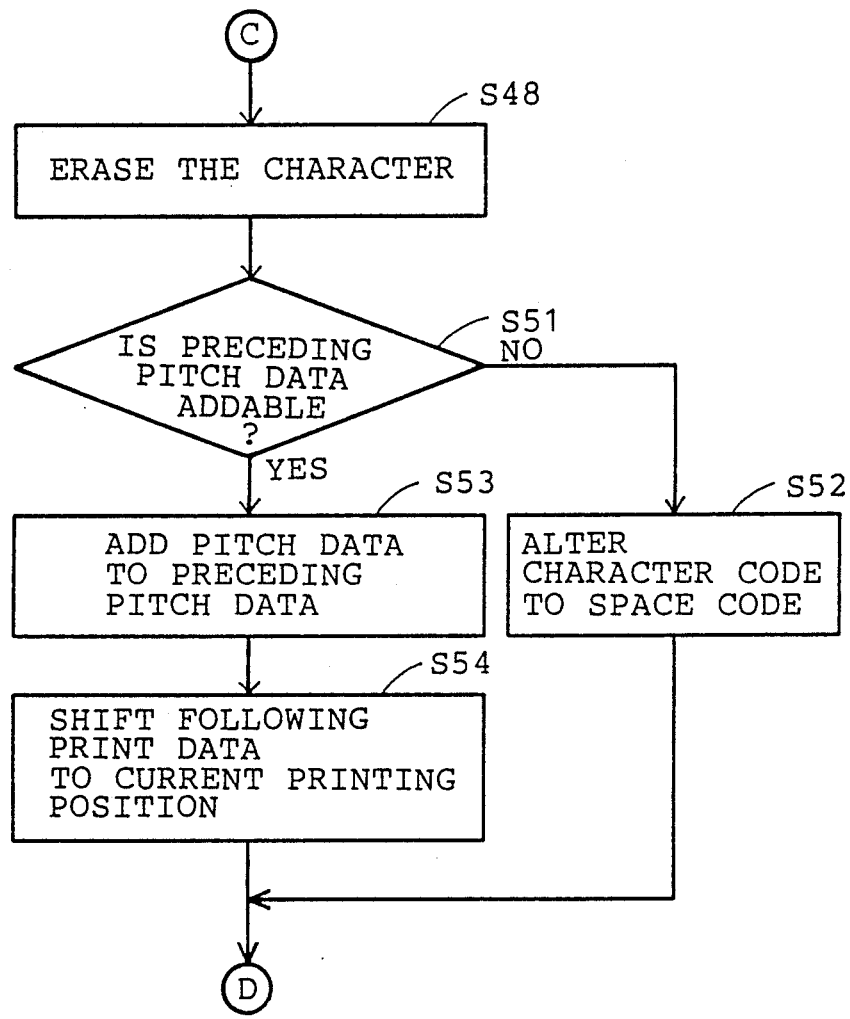

The character erasing process is set forth with reference to the flowcharts of FIGS. 7A and 7B.

At S45, it is determined whether at least one print data 31 is stored in the correction memory 28. If the answer is NO, namely, there is no print data in the correction memory 28, the alarm is actuated at S46. On the other hand, if there is at least one print data 31 in the correction memory 28, it is determined at S47 whether the print data 31 at the current printing position is not the space data. In the present embodiment, the print data 31 corresponding to the character 'K' is erased at S48. If the data corresponding to the current printing position is not a print data, it is determined at S49 whether the character code 31a of the print data 31 in the preceding column of the current printing position is a space code 33. If the answer is NO, the printing head 7 is moved to the preceding column (backspaced) at S50, and the process step proceeds to S48 at which the character is erased. Thus, the character 30 printed on the paper 4 is erased.

The processing of the print data 31 stored in the correction memory 28 is set forth.

At S51, it is determined whether the pitch data 31b corresponding to the erased character 30 can be added to the pitch data 31b of the print data 31 in the preceding column of the print data 31b corresponding to the erased character 30. If the answer is NO, only the character code 31a of the print data 31 corresponding to the erased character 30 is altered to the space code 33 at S52. For example, when 'K' is erased as shown in FIG. 3, the pitch data 31b of the print data 31 corresponding to the space in the preceding column of the current printing position is '1'. In this case, '1' is added to the pitch data 31b of the print data 31 in the preceding column of the erased character 30 at S53 so that the pitch data becomes '2'. At S54, the print data 31 in the next column of the current printing position is shifted backward by one column to fill a blank space.

On the other hand, if the answer is YES at S49, namely, when there is no print data 31 in the current printing position or the print data 31 is a space data, and also the print data 31 in the preceding column is a space data, the printing head 7 is moved to the preceding column (backspaced) at S55. At subsequent S56, it is determined whether there is any print data 31 in the correction memory 28 in the next column of the current printing position. If the answer is NO, the print data 31 corresponding to the last space is not required. Then, it is determined at S57 whether the pitch data 31b of the space code 33 corresponding to the erased or backspaced position is '2'. If the answer is YES, '1' is subtracted from the pitch data 31b at S58. If the result is '1' at S57, the print data 31 corresponding to the space is erased at S59.

When it is determined that the relocation key 17 is operated, the whole pitch data 31b stored in the correction memory 28 is added to the initial position data (6th column) in the position register 29 which stores the position of the initial print data 31 in the correction memory 28. In this case, since the total sum of the whole pitch data 31b of the correction memory 28 is '12', '12' is added to '6' (the initial position data stored in the position register 29) so that the latest input position (18th column) is determined. In accordance with the calculated input position (18th column) and the position stored in the head counter of the work memory 27 shown by an arrow H3, the carriage drive circuit 24 and the carriage driving motor 12 are actuated so that the printing head 7 is relocated to the latest input position shown by an arrow H4. Then, the CPU 18 waits to receive new data input at S3.

Accordingly, in the CPU 18 of the present embodiment, there is no need to prepare a memory space for storing the latest input position in order to restore the printing head 7 from the correction position to the latest input position. The latest input position can be calculated based on the initial position data in the position register 29 and the pitch data 31b in the correction memory 28.

Figure 8:
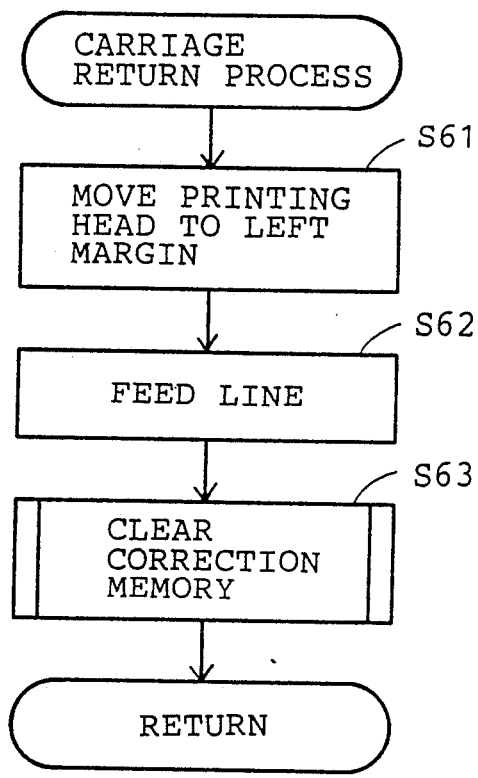
FIG. 8 is a flowchart of a carriage returning process.

When it is determined at S8 that the carriage return key 34 is operated, the program proceeds to S9 at which the carriage returning operation is executed in accordance with the flowchart of FIG. 8. First, at S61, the printing head 7 is moved to the left margin by actuating the carriage driving motor 12. At subsequent S62, the line feed motor 11 is driven to feed the line by a predetermined interval. Then, the correction memory 28 is cleared at S63 in accordance with the flowchart of FIG. 5.

When any key excepting the character key 2a the correction key 16 and the carriage return key 34, e.g., the back space key 15, is operated, the CPU 18 determines at S10 to execute the operation corresponding to the key 2a.

While the invention has been particularly shown and described with reference to a preferred embodiment, it will be understood by those skilled in the art that various other changes in form and detail may be made without departing from the spirit and scope of the invention. For example, the compressible memory space is not limited to only '1'. By optionally changing the bit corresponding to the pitch data 31b, it is possible to add (compress) the pitch data 31b to be more than '3'. Namely, more than two spaces can be compressed.

What is claimed is:

1. A printing device with a text data memory and a printing head, the printing device comprising:
   input means for inputting character data and space data;
   data coding means for making a first character print data by combining a character code data corresponding to the character data input through the input means and a normal printing pitch data when the character data is followed by another character data, and for making a second character print data by combining a character code data corresponding to the character data input through the input means and an extended printing pitch data when the character data is followed by a space data; and
   data storing means for serially storing the first and second character print data in the text data memory.

2. An electronic typewriter equipped with the printing device according to claim 1.

3. A word processor equipped with the printing device according to claim 1.

4. A printing device according to claim 1, wherein each of the normal printing pitch data and the extended printing pitch data is one-bit data, and the printing device further comprises a printing controller for printing a character and proceeding the printing head by one character pitch responsive to the print data including the normal printing pitch data, and for printing a character and proceeding the printing head by two character pitches responsive to the print data including the extended printing pitch data.

5. A printing device according to claim 4, wherein the data coding means further includes means for making a first space print data by combining a space code data and the normal printing pitch data when the space data follows the print data including the extended printing pitch data, and for making a second space print data by combining the space code data and the extended printing pitch data when the space data follows the first space print data.

* * * * *